(12) United States Patent
Kim et al.

(10) Patent No.: US 8,841,659 B2
(45) Date of Patent: Sep. 23, 2014

(54) ORGANIC LIGHT-EMITTING DISPLAY APPARATUS

(71) Applicant: Samsung Display Co., Ltd., Yongin (KR)

(72) Inventors: Se-Il Kim, Yongin (KR); Sung-Soo Lee, Yongin (KR); Eun-Kyoung Nam, Yongin (KR); Sang-Eok Jang, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/940,491

(22) Filed: Jul. 12, 2013

(65) Prior Publication Data

US 2014/0166997 A1 Jun. 19, 2014

(30) Foreign Application Priority Data

Dec. 14, 2012 (KR) ........................ 10-2012-0146635

(51) Int. Cl.
H01L 27/32 (2006.01)
H01L 27/12 (2006.01)

(52) U.S. Cl.
CPC ......... H01L 27/3258 (2013.01); H01L 27/1248 (2013.01); H01L 27/3244 (2013.01); H01L 27/3209 (2013.01)
USPC ........... 257/40; 257/59; 257/72; 257/E33.063

(58) Field of Classification Search
CPC ............... H01l 27/1214; H01l 27/3209; H01l 27/3244; H01l 27/1248; H01l 29/66765
USPC ........................ 257/40, 59, 71, 72, E33.063
See application file for complete search history.

(56) References Cited

U.S. PATENT DOCUMENTS

| 7,061,174 | B2 | 6/2006 | Nishikawa et al. | |
| 8,698,134 | B2* | 4/2014 | Kim et al. | 257/40 |
| 2010/0078631 | A1* | 4/2010 | Pieh | 257/40 |
| 2013/0069085 | A1* | 3/2013 | Kang et al. | 257/88 |
| 2013/0161631 | A1* | 6/2013 | Lee et al. | 257/71 |
| 2013/0175512 | A1* | 7/2013 | Kim et al. | 257/40 |
| 2014/0054555 | A1* | 2/2014 | Kim et al. | 257/40 |
| 2014/0061598 | A1* | 3/2014 | Kim et al. | 257/40 |

FOREIGN PATENT DOCUMENTS

| JP | 2006-073642 | 8/2004 |
| JP | 2004-227853 | 12/2004 |
| KR | 10-2010-0131800 | 12/2010 |
| KR | 10-2012-0040853 | 4/2012 |
| KR | 10-2012-0072949 | 7/2012 |

* cited by examiner

Primary Examiner — Michael Lebentritt
(74) Attorney, Agent, or Firm — Knobbe Martens Olson & Bear LLP

(57) ABSTRACT

An organic light-emitting display apparatus that has reduced resonance effect includes a thin film transistor (TFT) layer including a plurality of TFTs, first protective layer covering the TFT, a color filter disposed in at least a partial area of the region in the first protective layer, a first overcoat covering the color filter, a second protective layer covering the first overcoat, a second overcoat disposed on the second protective layer, and a pixel electrode disposed on top of the second overcoat and electrically coupled to the TFTs in the TFT layer.

10 Claims, 4 Drawing Sheets

ORGANIC LIGHT-EMITTING DISPLAY APPARATUS

CROSS-REFERENCE TO RELATED APPLICATIONS

This application claims the benefit of Korean Patent Application No. 10-2012-0146635, filed on Dec. 14, 2012, in the Korean Intellectual Property Office, the disclosure of which is incorporated herein in its entirety by reference.

BACKGROUND

1. Field

The present disclosure relates to an organic light-emitting display apparatus that has reduced resonance effect.

2. Description of the Related Technology

An organic light-emitting display apparatus is a display apparatus having an organic light-emitting device (OLED) in a display region. An OLED includes a pixel electrode and an opposite electrode facing each other, and an intermediate layer interposed between the pixel electrode and the opposite electrode. The intermediate layer includes an emissive layer (EML).

Depending on driving types, an organic light-emitting display apparatus is classified into an active matrix OLED and a passive matrix OLED. In an active matrix OLED, thin film transistors (TFT) included in each subpixel control whether the subpixel emits light or not. In a passive matrix OLED, electrodes arranged in a matrix shape control whether the subpixel emits light or not. In case of an active matrix OLED, OLEDs are conventionally placed on top of TFTs.

One of the conventional organic light-emitting display apparatuses is a bottom-emission type organic light-emitting display apparatus in which light is emitted from an EML to the outside of the apparatus through a layer including TFTs in a lower portion of the organic light-emitting display apparatus. In the bottom-emission type organic light-emitting display apparatus, the layer where TFTs are arranged generates unintended resonance, which may cause an unintended state of color balance in the emitted light.

SUMMARY OF CERTAIN INVENTIVE ASPECTS

The present disclosure provides an organic light-emitting display apparatus that has reduced resonance effect According to an aspect of the present invention, there is provided an organic light-emitting display apparatus including a thin film transistor (TFT) layer including a plurality of TFTs, a first protective layer covering the TFT layer, a color filter disposed in at least a partial area of the first protective layer, a first overcoat covering the color filter, a second protective layer covering the first overcoat, a second overcoat on the second protective layer, and pixel electrodes disposed on the second overcoat and electrically coupled to the plurality of TFTs in the TFT layer.

The first overcoat may be formed on top of the first protective layer to cover the color filter.

The TFT layer includes at least one of a gate insulating layer and an interlayer insulating layer, and the first overcoat may be thicker than at least one of the gate insulating layer and the interlayer insulating layer The second overcoat may be thicker than the second protective layer.

The first and second overcoats may be formed of acrylic-based organic materials.

The first overcoat may include a first section and a second section, the first section being formed on the first protective layer to cover upper and lateral surfaces of the color filter, and the second section being spaced apart from the first section and formed in an area of the first protective layer where the color filter is not arranged.

The second protective layer may be in contact with the first protective layer by filling the space between the first section and the second section in the first overcoat.

The second protective layer may cover upper and lateral surfaces of the first section in the first overcoat.

The pixel electrodes may be electrically coupled to the TFTs in the TFT layer through a portion of the second protective layer corresponding to the space between the first section and the second section of the first overcoat, such that the pixel electrodes do not to contact with the first overcoat.

The first overcoat is formed on top of the first protective layer to cover upper and lateral surfaces of the color filter. Also, the color filter is integrally formed throughout a display region, the color filter not forming an inner surface of a via hole to electrically couple the pixel electrodes with the TFT layer.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Figure 1:
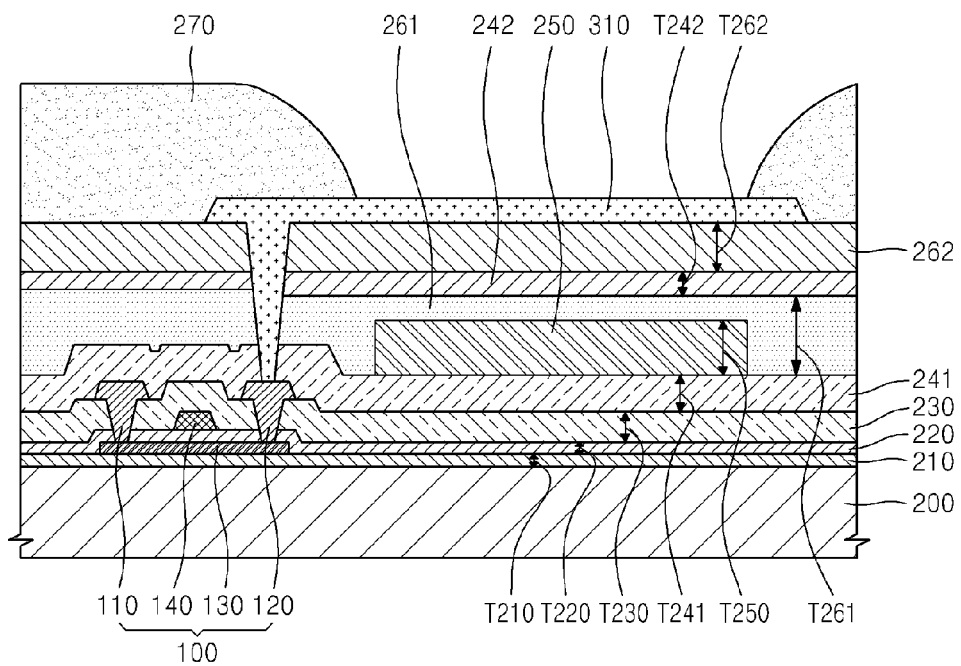
FIG. 1 is a cross-sectional view schematically illustrating a portion of an organic light-emitting display apparatus according to an embodiment of the present invention.

Hereinafter, as the invention allows for various changes and numerous embodiments, particular embodiments will be illustrated in the drawings and described in detail in the written description. However, this is not intended to limit the present invention to particular modes of practice, and it is to be appreciated that all changes that do not depart from the spirit and technical scope of the present invention are encompassed in the present invention. It will be understood by those skilled in the art that various changes in form and details may be made therein without departing from the spirit and scope of the invention. And in the drawing, for convenience of description, the thickness of some layers and regions may be shown reduced or exaggerated.

In the present specification, when a part of layer, film, region, or the like is meant to be "above" or "on" the other parts, it is to be understood that it is not only "right above" the other parts, but also in another part therebetween. Expressions such as "at least one of," when preceding a list of elements, modify the entire list of elements and do not modify the individual elements of the list.

FIG. 1 is a cross-sectional view schematically illustrating a portion of an organic light-emitting display apparatus according to an embodiment of the present invention.

Referring to FIG. 1, an organic light-emitting display apparatus includes a thin film transistor (TFT) layer having a TFT 100, a first protective layer 241, a color filter 250, a first overcoat 261, a second protective layer 242, a second overcoat 262, and a pixel electrode 310.

The TFT layer includes the TFT 100, but may also include other various types of layers. The TFT layer may be disposed on top of a substrate 200, and the substrate 200 may be formed of a variety of materials such as glass, metal, or plastic materials like polyethylen terephthalate (PET), polyethylen naphthalate (PEN), and polyimide.

As illustrated in FIG. 1, in some embodiments, a buffer layer 210 may be interposed between the substrate 200 and the TFT layer. The buffer layer 210 may be formed of silicon oxide and/or silicon nitride and may serve to prevent intrusion of impurities from the inside or outside of the substrate 200 into the TFT layer. The buffer layer 210 may have different functions depending on the need. For example, the buffer layer 210 may serve to planarize a surface of the substrate 200.

The TFT 100 in the TFT layer may include a source electrode 110, a drain electrode 120, a semiconductor layer 130 in contact with each of the source and drain electrodes 110 and 120, and a gate electrode 140.

The semiconductor layer 130 may be formed of an amorphous or a polycrystalline silicon layer or organic semiconductor materials. Although not illustrated in FIG. 1 in detail, the semiconductor layer 130 may include a source region and a drain region, which are doped by a dopant, and a channel region.

The gate electrode 140 is disposed on top of the semiconductor layer 130, and according to a signal applied to the gate electrode 140, the source electrode 110 and the drain electrode 120 may be electrically coupled to each other. The gate electrode 140 may be formed in a single layer or multilayer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering adhesion to adjacent layers, surface planarization of deposited layers, and processibility. In order to ensure insulation between the semiconductor layer 130 and the gate electrode 140, a gate insulating layer 220, which is formed of silicon oxide and/or silicon nitride, may be interposed between the semiconductor layer 130 and the gate electrode 140.

An interlayer insulating layer 230, which is formed of silicon oxide and/or silicon nitride, may be disposed on top of the gate electrode 140. The source and drain electrodes 110 and 120 may be disposed on top of the interlayer insulating layer 230. The source and drain electrodes 110 and 120 may be electrically coupled to the semiconductor layer 130 through contact holes formed in the interlayer insulating layer 230 and the gate insulating layer 220. In consideration of conductivity, the source and drain electrodes 110 and 120 may be formed in a single layer or multilayer including at least one of Al, Pt, Pd, Ag, Mg, Au, Ni, Nd, Ir, Cr, Li, Ca, Mo, Ti, W, and Cu.

The first protective layer 241 is provided to protect the TFT 100 placed in a lower portion of the organic light-emitting display apparatus and may be formed of inorganic materials such as silicon oxide and/or silicon nitride.

The color filter 250 on top of the first protective layer 241 selectively passes light of a predetermined specific wavelength band only emitted from an emissive layer (EML) above the color filter 250, thereby providing a full-color organic light-emitting display apparatus. The color filter 250 is disposed in at least a partial area of the first protective layer 241. The color filter 250 may be patterned to correspond to each pixel electrode 310 as illustrated in FIG. 1 or may be formed as a single body throughout a plurality of subpixels. In the latter case, the color filter 250 may be formed over the subpixels that emit light of the same wavelength band. Various modifications of a color filter are also possible. For example, a color filter having regions that pass light of different wavelength bands may be formed as a single body over the subpixels that emit light of different wavelength bands.

The first overcoat 261 is formed to cover the color filter 250. The first overcoat 261, such as, for example, a planar layer, is formed to provide the first overcoat 261 with a planar upper surface, in spite of arrangement of various components including the TFT 100 under the first overcoat 261. The upper surface of the first overcoat 261 may be planar despite the curvature under the first overcoat 261. For the planarization, the first overcoat 261 is formed of organic materials such as acrylic-based organic material or benzocyclobutene (BCB). The first overcoat 261 may also be able to suppress generation of resonance by the layers forming the TFT 100 under the first overcoat 261 or other layers, which are described below.

The second protective layer 242 may cover the first overcoat 261 and may be formed of inorganic materials such as silicon oxide and/or silicon nitride. The second protective layer 242 may prevent downscaling of the pixel, in which an area of the emitting region in each pixel (or subpixel) is reduced.

During a manufacturing process, or during use of an organic light-emitting display apparatus after the manufacturing, outgassing may occur in the color filter 250. Gas may affect organic and/or inorganic materials including the EML on the pixel electrode 310 and accordingly cause downscaling of the pixel. Gas from the color filter 250 may not be easily blocked by the first overcoat 261 which is formed of organic materials. However, the second protective layer 242, which is formed of inorganic materials to cover the first overcoat 161, may minimize gas influence on the organic and/or inorganic materials including the EML on the pixel electrode 310.

The second overcoat 262 may be disposed on top of the second protective layer 242. Like the first overcoat 261, the second overcoat 262 is a planar layer and may be formed to have a planar upper surface in spite of arrangement of various components under the second overcoat 262. The upper surface of the second overcoat 262 may be planar despite the curvature under the second overcoat 262. For the planarization, the second overcoat 262 is formed of organic materials such as acrylic-based organic material or BCB. The second overcoat 262 may also be able to suppress generation of resonance by the second protective layer 242 under the second overcoat 262, which is described below.

The pixel electrode 310 is formed on top of the second overcoat 262 and is electrically coupled to the source and drain electrodes 110 and 120 of the TFT 100 through via holes penetrating the various layers under the pixel electrode 310. The application of an electrical signal to the pixel electrode 310 is controlled by the TFT 100 and, accordingly, the emission of light or a degree of light emission in the EML on the pixel 310 may be controlled. The pixel electrode 310 may be formed as a (semi)transparent electrode of, for example, indium tin oxide (ITO), indium zinc oxide (IZO), zinc oxide (ZnO), indium oxide ($In_2O_3$), indium galium oxide (IGO), or aluminium zinc oxide (AZO). The composition or material of the pixel electrode 310 is not limited thereto and may be modified in various ways. As illustrated in FIG. 1, the via holes penetrate the first protective layer 241, the second protective layer 242, and the second overcoat 262. Inner surfaces of the via holes are composed of the first protective layer 241, the second protective layer 242, and the second overcoat 262.

A pixel defining layer (PDL) 270 may be formed on top of the second overcoat 262. The PDL 270 defines a pixel by having an aperture that corresponds to each subpixel, that is, an aperture that exposes a central portion or the entire portion of the pixel electrode 310. In addition, the PDL 270 may prevent arc occurrence or the like at an end of the pixel electrode 310 by increasing a distance between the end of the pixel electrode 310 and an opposite electrode (not illustrated) above the pixel electrode 310. The PDL 270 may be formed of organic materials such as polyimide.

Although not illustrated in FIG. 1, the opposite electrode is disposed above the pixel electrode 310, and an intermediate layer including the EML may be formed between the pixel electrode 310 and the opposite electrode.

The opposite electrode may be formed as a single body throughout a plurality of pixels to cover a display region (active region). The display region refers to all areas where light may be emitted in the whole organic light-emitting display apparatus, that is, all regions except the edge part of the organic light-emitting apparatus where a controller is located. When there is no dead area on an entire surface of the organic light-emitting display apparatus, the entire surface thereof may be referred as the display region. The opposite electrode is in contact with an electrode power supply line outside the display region and receives electrical signal from the electrode power supply line. The opposite electrode may be formed as a reflection-type electrode, that is, the opposite electrode may be a layer including at least one of, for example, Li, Ca, LiF/Ca, LiF/Al, Al, Ag, and Mg. The composition or material of the opposite electrode is not limited thereto and may be modified in various ways.

The intermediate layer interposed between the pixel electrode 310 and the opposite electrode may include small molecule or polymer materials. When the intermediate layer is formed of small molecule materials, a hole injection layer (HIL), a hole transport layer (HTL), an emissive layer (EML), an electron transport layer (ETL), an electron injection layer (EIL), or the like may be sequentially stacked in a single or multiple structure. Organic materials may be a wide variety of materials such as copper phthalocyanine (CuPc), N, N'-Di (naphthalene-1-yl)-N,N'-diphenyl-benzidine (NPB), tris-8-hydroxyquinoline aluminum (Alq3), or the like. Such layers may be formed by a method of vacuum deposition or a laser induced thermal imaging (LITI).

When the intermediate layer is formed of polymer materials, the intermediate layer may have a structure with a HTL and an EML, wherein the HTL is formed of polymer materials such as poly-(3,4)-ethylene-dihydroxy thiophene (PEDOT) or polyaniline (PANT) and the EML is formed of polymer materials such as poly-phenylenevinylene (PPV) or polyfluorene. Such layers may be formed by a method of screen printing, inkjet printing, or LITI.

The structure of the intermediate layer is not limited thereto and may be modified in various ways.

The organic light-emitting display apparatus according to an embodiment of the present invention may effectively prevent color imbalance of the emission light due to the unintended resonance.

As described above, the buffer layer 210 or the first protective layer 241 in addition to the gate insulating layer 220 or the interlayer insulating layer 230 forming the TFT 100 is disposed under the pixel electrode 310 through which light from the intermediate layer including the EML passes. Accordingly, light which is emitted downward through the pixel electrode 310 causes weak resonance by repeating transmission and semi-transmission through the layers. As a result, an external light coupling efficiency of a specific wavelength band becomes higher than that of a different wavelength band. Therefore, the problem of unintended color imbalance of the final emission light may occur.

However, the organic light-emitting display apparatus according to an embodiment of the present invention may prevent the unintended weak resonance by the first overcoat 261 which is disposed on and above the layers. The weak resonance that is generated by the buffer layer 210, the gate insulating layer 220, the interlayer insulating layer 230, and the first protective layer 241 occurs when the wavelength of weak resonance and the length of weak resonance pathway satisfy a particular relationship. Therefore, the resonance may be effectively prevented by forming a thickness T261 of the first overcoat 261 thicker than a thickness T210 of the buffer layer 210, a thickness T220 of the gate insulating layer 220, a thickness T230 of the interlayer insulating layer 230, and a thickness T241 of the first protective layer 241.

For example, the thickness T210 of the buffer layer 210 is about 1000 Å to about 3000 Å, the thickness T220 of the gate insulating layer 220 is about 400 Å to about 450 Å, the thickness T230 of the interlayer insulating layer 230 is about 2000 Å to about 3000 Å, and the thickness T241 of the first protective layer 241 is about 4000 Å. When forming the T261, i.e., the thickness of the first overcoat 261, to be approximately 4 μm, which is much thicker than those of the above-mentioned layers, the layers under the pixel electrode 310, i.e., the layers down to the first overcoat 261, may efficiently suppress the weak resonance occurring with respect to the specific wavelength band. For reference, a thickness T250 of the color filter 250 covered by the first overcoat 261 may be approximately 3 μm.

As described above, in order to prevent the gas generated from the color filter 250 from affecting the intermediate layer above the pixel electrode 310, the second protective layer 242 is formed of inorganic materials to cover the first overcoat 261. In this case, a thickness T242 of the second protective layer 242 is about 1400 Å, which is so thin that the second protective layer 242 disposed on top of the first overcoat 261 may cause unintended weak resonance despite the presence of the first overcoat 261.

However, the organic light-emitting display apparatus according to an embodiment of the present invention has the second overcoat 262 on top of the second protective layer 242. Therefore, occurrence of the weak resonance may be effectively suppressed. For example, a thickness T242 of the second protective layer 242 is about 1400 Å. When a thickness T262 of the second overcoat 262 is formed to be about 1 μm which is much thicker that the T242, the weak resonance with respect to the specific wavelength band due to the second protective layer 242 may be efficiently suppressed.

Figure 2:
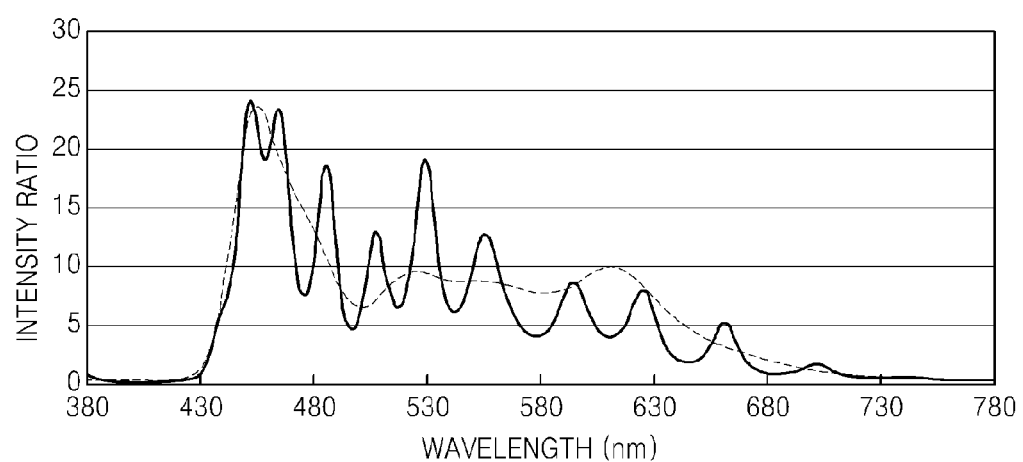
FIG. 2 is a graph showing a relationship between light intensity and wavelength of the lights emitted by the organic light-emitting display apparatus of FIG. 1 and a comparative example.

FIG. 2 is a graph showing a relationship between light intensity and wavelength of the lights emitted by the organic light-emitting display apparatus of FIG. 1 and a comparative example. The organic light-emitting display apparatus according to a comparative example has the same configuration except the second overcoat 262 of the organic light-emitting display apparatus according to an embodiment of the present invention.

The curve indicated by a solid line in FIG. 2 represents light intensity depending on the wavelength of the light from the organic light-emitting display apparatus of an embodiment of the present invention, and the curve indicated by a dotted line represents light intensity depending on the wavelength of the light from the organic light-emitting display apparatus of a comparative example.

As illustrated in FIG. 2, in the organic light-emitting display apparatus of the comparative example, there is only one peak that is specifically prominent at a wavelength corresponding to blue light, which is a result of weak resonance occurred with respect to the wavelength corresponding to the blue light. Therefore, the final emission light is recognized blue as a whole due to the broken white balance. However, in the organic light-emitting display apparatus of the embodiment of the present invention, there are more peaks at various wavelengths than that of the organic light-emitting display apparatus of the comparative example, and the peaks are formed densely. That is, light of high brightness is emitted at various wavelengths, and it is understood that the white balance of the final emission light is maintained.

Figure 3:
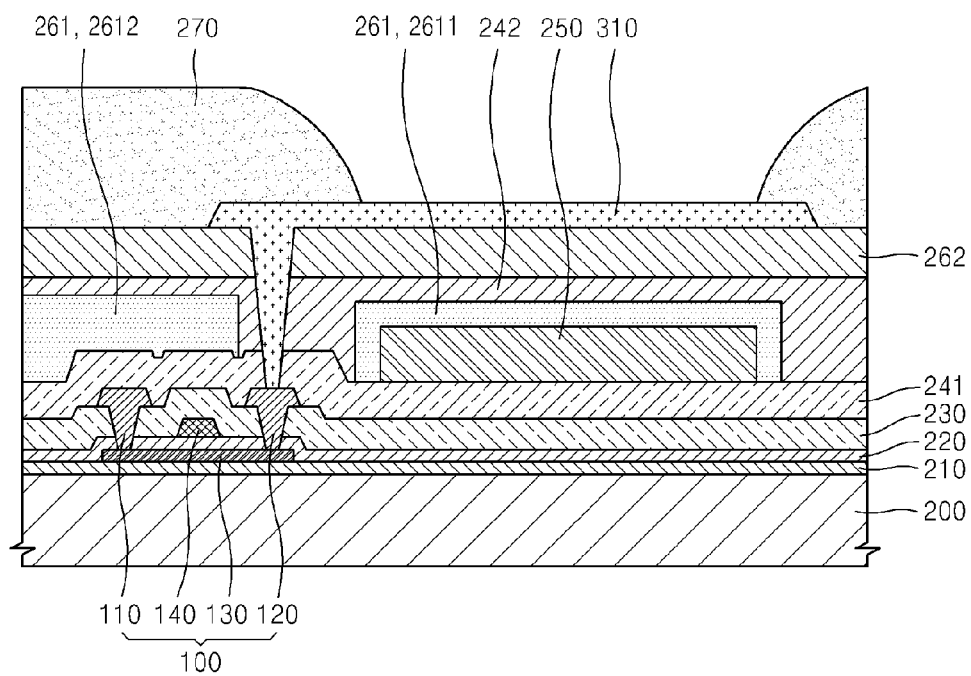
FIG. 3 is a cross-sectional view schematically illustrating a portion of an organic light-emitting display apparatus according to another embodiment of the present invention.

FIG. 3 is a cross-sectional view schematically illustrating a portion of an organic light-emitting display apparatus according to another embodiment of the present invention.

In the organic light-emitting display apparatus of the embodiment of the present invention, the color filter 250 is disposed on one portion of the region in the first protective layer 241, and the first overcoat 261 is formed on top of the first protective layer 241 to cover the color filter 250. The first overcoat 261 includes first and second sections 2611 and 2612. The first section 2611 is formed on top of the first protective layer 241 to cover upper and side surfaces of the color filter 250. The second section 2612 is formed on a portion of the region which is spaced apart from the first section 2611 in the first protective layer 241, the portion where the color filter 250 on the first protective layer 241 is not disposed. Furthermore, the second protective layer 242 fills the space between the first and second sections 2611 and 2612 in the first overcoat 261 to be in contact with the protective layer 241. The second protective layer 242 covers upper and side surfaces of the first portion 2611 in the first overcoat 261. A bottom surface of the first overcoat 261 is in contact with the first protective layer 241.

As described above, outgassing may occur from the color filter 250 so that the first overcoat 261 covering the color filter 250 may not efficiently prevent gas from the color filter 250. Therefore, when the first overcoat 261 covering the color filter 250 is extended to the via hole used to electrically couple the pixel electrode 310 with the TFT 100, gas from the color filter 250 may affect the intermediate layer on top of the pixel electrode 310 through the first overcoat 261 and via hole, causing problems such as downscaling of the pixel.

However, in the organic light-emitting display apparatus of the embodiment of the present invention, the first overcoat 261 includes the first section 2611 and the second portion 2612 which is spaced apart from the first portion 2611, and the second protective layer 242 fills the space between the first and the second sections 2611 and 2612 in the first overcoat 261 to be in contact with the protective layer 241. Therefore, the color filter 250 is positioned to be isolated from the first and second protective layers 241 and 242 so that even though gas is generated from the color filter 250, gas influence on the intermediate layer on top of the pixel electrode 310 may be efficiently prevented.

In addition, as illustrated in the drawings, the pixel electrode 310 may be electrically coupled to the TFT 100 in the TFT layer through a portion of the region in the second protective layer 242, the portion that corresponds to the space between the first and second sections 2611 and 2612 in the first overcoat 261 to avoid contact with the first overcoat 261.

Figure 4:
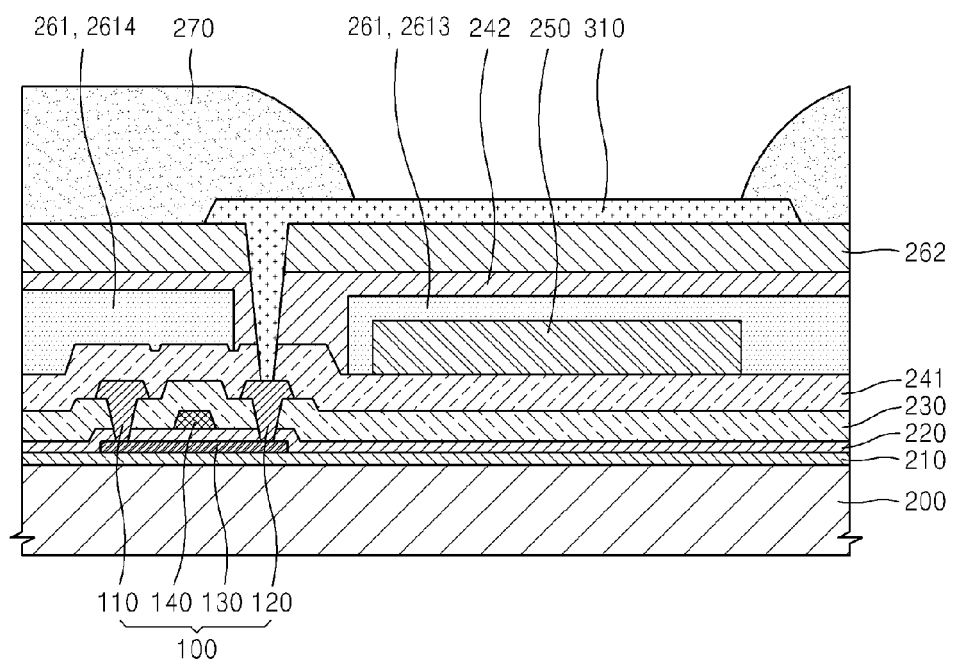
FIG. 4 is a cross-sectional view schematically illustrating a portion of an organic light-emitting display apparatus according to another embodiment of the present invention.

FIG. 4 is a cross-sectional view schematically illustrating a portion of an organic light-emitting display apparatus according to another embodiment of the present invention.

In the organic light-emitting display apparatus of the embodiment of the present invention, the first overcoat 261 includes the first section 2613 covering the color filter 250 and the second section 2614 which is spaced apart from the first portion 2611. Thereby, the first overcoat 261 is not in contact with the pixel electrode 310 and thus, gas from the color filter 250 may be prevented from affecting the intermediate layer on top of the pixel electrode 310 through the first overcoat 261. However, unlike the organic light-emitting display apparatus according to the embodiment described in FIG. 3, the organic light-emitting display apparatus according to the embodiment of FIG. 4 may not be in a pattern designed for the first section 2613 in the first overcoat 261 to correspond to the color filter 250. The first section 2613 in the first overcoat 261 may cover the color filter of the adjacent subpixels by being extended thereto, and furthermore, to the outer surface of the display region.

Various modifications of the first overcoat are also possible. For example, unlike the description so far, the first overcoat may be integrally formed on the display regions but may not include the region having the via hole used to electrically couple the pixel electrode 310 with the TFT 100. That is, the first overcoat may not be formed to fulfill the inner surface of the via hole.

According to embodiments of the present invention, the organic light-emitting display apparatus having reduced resonance effect may be implemented, and the scope of the present invention is not limited thereto due to the effect.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
    a thin film transistor (TFT) layer comprising a plurality of TFTs;
    a first protective layer covering the TFT layer;
    a color filter disposed in at least a partial area of the first protective layer;
    a first overcoat covering the color filter;
    a second protective layer covering the first overcoat;
    a second overcoat on the second protective layer; and
    pixel electrodes disposed on the second overcoat and electrically coupled to the plurality of TFTs in the TFT layer.

2. The organic light-emitting display apparatus of claim 1, wherein the first overcoat is formed on the first protective layer to cover the color filter.

3. The organic light-emitting display apparatus of claim 1, wherein the TFT layer comprises at least one of a gate insulating layer and an interlayer insulating layer, and wherein a thickness of the first overcoat is larger than a thickness of at least one of the gate insulating layer and the interlayer insulating layer.

4. The organic light-emitting display apparatus of claim 1, wherein a thickness of the second overcoat is larger than a thickness of the second protective layer.

5. The organic light-emitting display apparatus of claim 1, wherein the first and second overcoats are formed of acryl-based organic materials.

6. The organic light-emitting display apparatus of claim 1, wherein the first overcoat comprises a first section and a second section, the first section being formed on the first protective layer to cover upper and lateral surfaces of the color filter, and the second section being spaced apart from the first section and formed in an area of the first protective layer where the color filter is not arranged.

7. The organic light-emitting display apparatus of claim 6, wherein the second protective layer is in contact with the first protective layer by filling the space between the first section and the second section in the first overcoat.

8. The organic light-emitting display apparatus of claim 7, wherein the second protective layer covers upper and lateral surfaces of the first section of the first overcoat.

9. The organic light-emitting display apparatus of claim 7, wherein the pixel electrodes are electrically coupled to the TFTs in the TFT layer through a portion of the second protective layer corresponding to the space between the first section and the second section of the first overcoat, such that the pixel electrodes do not contact with the first overcoat.

10. The organic light-emitting display apparatus of claim 1, wherein the first overcoat is formed on top of the first protective layer to cover upper and lateral surfaces of the color filter, and is integrally formed throughout a display region, the color filter not forming an inner surface of a via hole to electrically couple the pixel electrodes with the TFT layer.

\* \* \* \* \*